(12) United States Patent
Kobayashi (10) Patent No.: US 7,750,402 B2
(45) Date of Patent: Jul. 6, 2010

(54) LATERAL PLANAR TYPE POWER SEMICONDUCTOR DEVICE INCLUDING DRAIN BURIED REGION IMMEDIATELY BELOW DRAIN REGION AND ITS MANUFACTURING METHOD

(75) Inventor: Kenya Kobayashi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 227 days.

(21) Appl. No.: 10/925,035

(22) Filed: Aug. 25, 2004

(65) Prior Publication Data

US 2005/0045946 A1 Mar. 3, 2005

(30) Foreign Application Priority Data

Aug. 28, 2003 (JP) .............................. 2003-305519

(51) Int. Cl.
H01L 21/425 (2006.01)
(52) U.S. Cl. .............................. 257/336; 257/E21.427; 438/270
(58) Field of Classification Search ......... 257/335–344, 257/E27.06, E21.427, E29.268; 438/270, 438/306, 307
See application file for complete search history.

(56) References Cited

U.S. PATENT DOCUMENTS

| 5,317,180 A * | 5/1994 | Hutter et al. ................. 257/337 |
| 5,485,027 A * | 1/1996 | Williams et al. ............ 257/343 |
| 6,559,494 B1 * | 5/2003 | Taniguchi .................... 257/306 |
| 2004/0119116 A1* | 6/2004 | Byeon et al. ................. 257/335 |
| 2008/0157227 A1* | 7/2008 | Manabe ....................... 257/401 |

FOREIGN PATENT DOCUMENTS

| JP | 04-038878 | 2/1992 |
| JP | 04-162678 | 6/1992 |
| JP | 5-029620 | 2/1993 |
| JP | 06-291076 | 10/1994 |
| JP | 07-030094 | 1/1995 |
| JP | 09-246540 | 9/1997 |

(Continued)

OTHER PUBLICATIONS

Japanese Office Action dated Apr. 13, 2010 (with partial English translation).

Primary Examiner—Lynne A Gurley
Assistant Examiner—Colleen A Matthews
(74) Attorney, Agent, or Firm—McGinn IP Law Group PLLC (57) ABSTRACT

In a power semiconductor device including a semiconductor substrate of a first conductivity type, a source region of a second conductivity type formed in a surface portion of the semiconductor substrate, and a drain drift region of the second conductivity type formed in the surface portion of the semiconductor substrate, the drain drift region being apart from the source region, a drain region of the second conductivity type is formed in a surface portion of the drain drift region. The drain region has a larger impurity concentration than the drain drift region. A drain buried region of the second conductivity type is formed immediately below the drain region in the drain drift region. The drain buried region has a larger impurity diffusion region than the drain drift region. A gate insulating layer is formed on the semiconductor substrate between the source region and the drain drift region, and a gate electrode is formed on the gate insulating layer.

20 Claims, 11 Drawing Sheets

FOREIGN PATENT DOCUMENTS

| | | |
|---|---|---|
| JP | 10-065150 | 3/1998 |
| JP | 11-251597 | 9/1999 |
| JP | 3206026 | 7/2001 |
| JP | 2001-274398 | 10/2001 |
| JP | 2002-158349 | 5/2002 |
| JP | 2002-334991 | 11/2002 |

* cited by examiner

LATERAL PLANAR TYPE POWER SEMICONDUCTOR DEVICE INCLUDING DRAIN BURIED REGION IMMEDIATELY BELOW DRAIN REGION AND ITS MANUFACTURING METHOD

BACKGROUND OF THE INVENTION

1. Field of the Invention

The present invention relates to a lateral planar type power semiconductor device such as a lateral planar type power metal oxide semiconductor (MOS, broadly, metal insulating semiconductor (MIS)) transistor and its manufacturing method.

2. Description of the Related Art

Power MOS transistors have been used to control high voltages and large currents. Such power MOS transistors have specific structures as compared with conventional non-power MOS transistors.

For example, a typical conventional non-power n-type MOS transistor is constructed by an $n^+$-type source impurity diffusion region and an $n^+$-type drain impurity diffusion region spaced in a $p^-$-type semiconductor substrate. On the other hand, a typical power n-type MOS transistor is constructed by an $n^+$-type source impurity diffusion region, an $n^+$-type drain impurity diffusion region spaced from the $n^+$-type source impurity diffusion region, and an $n^-$-type drain drift impurity diffusion region adjacent to the $n^+$-type drain impurity diffusion region between the two $n^+$-type impurity diffusion regions formed in a $p^-$-type semiconductor substrate. In this case, generally, the larger in size the $n^-$-type drain drift impurity diffusion region, the higher the breakdown voltage. Also, the smaller the impurity concentration of the $n^-$-type drain drift impurity diffusion region, the higher the breakdown voltage.

In order to increase the size of the above-mentioned drain drift impurity diffusion region, vertical type power MOS transistors rather than lateral type power MOS transistors are used; however, the vertical type power MOS transistors require a high manufacturing cost (see: FIG. 52 of JP-A-2001-274398).

Lateral power MOS transistors are divided into a groove type and a planar type. Since the lateral groove type power MOS transistors have deeper drain drift impurity diffusion regions, the lateral groove type power MOS transistors can be highly integrated (see: FIG. 1 of JP-A-2001-274398). However, the lateral groove type power MOS transistors require a high manufacturing cost.

While lateral planar type power MOS transistors are not so highly integrated, the lateral planar type power MOS transistors do not require a high manufacturing cost.

A prior art lateral planar type power MOS transistor is constructed by a semiconductor substrate of a first conductivity type, source and drain impurity diffusion regions of a second conductivity type spaced in a surface portion of the semiconductor substrate, a drain drift impurity diffusion region of the second conductivity type in the surface portion adjacent to the drain impurity diffusion region, and a base impurity diffusion region of the first conductivity type in the surface region adjacent to the source impurity diffusion region (see: JP-A-5-029620). This will be explained later in detail.

In the above-described prior art lateral planar type power MOS transistor, however, since carriers through a deeper stream in the drain drift impurity diffusion region have a longer motion distance than carriers through a shallow stream in the drain drift impurity diffusion region, the ON-resistance is substantially increased.

SUMMARY OF THE INVENTION

It is an object of the present invention to provide a lateral planar type power semiconductor device capable of decreasing the ON-resistance without substantially decreasing the breakdown voltage.

Another object is to provide a method for manufacturing such a lateral planar type power semiconductor device.

According to the present invention, in a power semiconductor device including a semiconductor substrate of a first conductivity type, a source region of a second conductivity type formed in a surface portion of the semiconductor substrate, and a drain drift region of the second conductivity type formed in the surface portion of the semiconductor substrate, the drain drift region being apart from the source region, a drain region of the second conductivity type is formed in a surface portion of the drain drift region. The drain region has a larger impurity concentration than the drain drift region. A drain buried region of the second conductivity type is formed immediately below the drain region in the drain drift region. The drain buried region has a larger impurity diffusion region than the drain drift region. A gate insulating layer is formed on the semiconductor substrate between the source region and the drain drift region, and a gate electrode is formed on the gate insulating layer.

Also, in a method for manufacturing a power semiconductor device, a drain drift region of a second conductivity type is formed in a surface portion of a semiconductor substrate of a first conductivity type. Then, a gate insulating layer is formed on the semiconductor substrate adjacent to the drain drift region, and a gate electrode is formed on the gate insulating layer. Then, a source region and a drain region of the second conductivity type are formed. In this case, the source region is in the surface region of the semiconductor substrate apart from the drain drift region, and the drain region is in the surface region of the drain drift region and has a larger impurity concentration than the drain drift region. Then, a drain buried region of the second conductivity type is formed immediately below the drain region in the drain region. In this case, the drain buried region has a larger impurity concentration than the drain drift region. Finally, a drain contact structure is electrically connected to the drain region.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art semiconductor device will be explained with reference to FIGS. 1 and 2.

Figure 1:
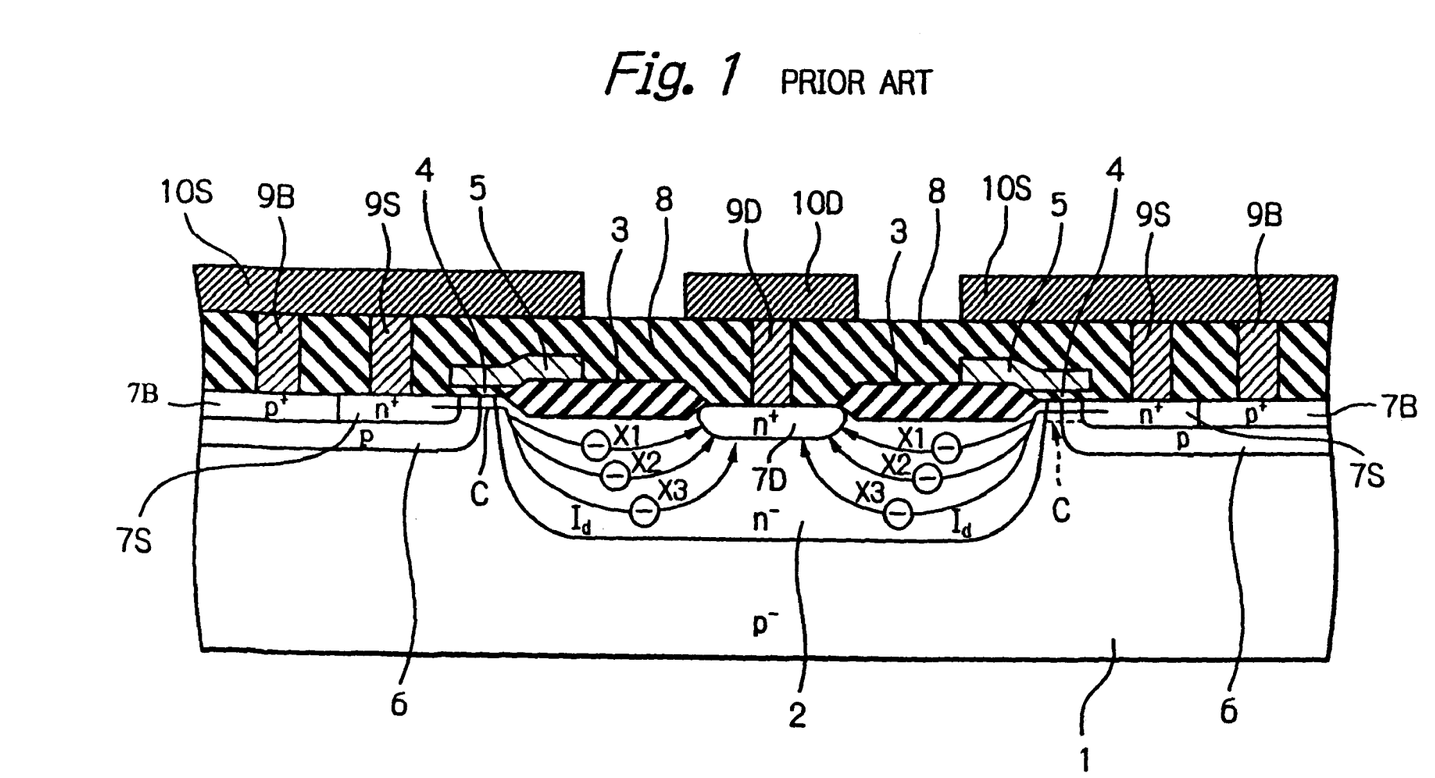
FIG. 1 is a cross-sectional view illustrating a prior art power semiconductor device.
Figure 2:
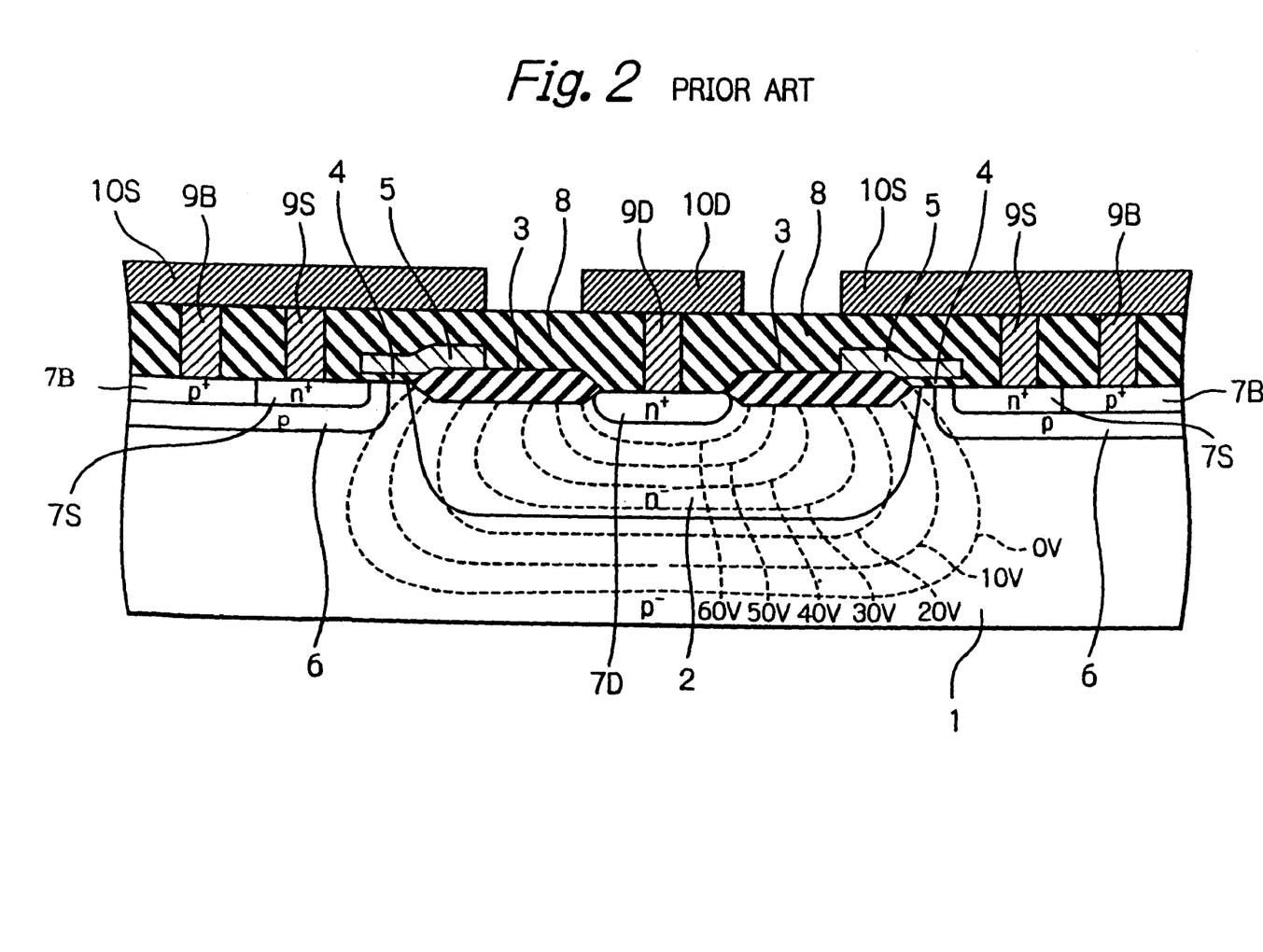
FIG. 2 is a cross-sectional view for explaining the operation of the power semiconductor device of FIG. 1.

In FIG. 1, which illustrates a prior art power semiconductor device of a lateral planar type (see: JP-A-5-029620), reference numeral 1 designates a p⁻-type monocrystalline silicon substrate in which an n⁻-type drain drift impurity diffusion region 2 is formed. A field silicon dioxide layer 3 is formed on the n⁻-type drain drift impurity diffusion region 2, and a gate silicon dioxide layer 4 is formed on the silicon substrate 1.

Also, a gate electrode 5 is formed on the gate silicon dioxide layer 4 and a part of the field silicon dioxide layer 3. A p-type base impurity diffusion region 6 is formed in self-alignment with the gate electrode 5.

Further, an n⁺-type source impurity diffusion region 7S and an n⁺-type drain impurity diffusion region 7D are formed, and a p⁺-type backgate impurity diffusion region 7B is formed.

Additionally, a silicon dioxide interlayer 8 is formed. A source contact structure 9S a drain contact structure 9S, a drain contact structure 9D and a backgate contact structure 9B are buried in the silicon dioxide interlayer 8, and are connected to the n⁺-type source impurity diffusion region 7S, the n⁺-type drain impurity diffusion region 7D and the p⁺-type backgate impurity diffusion region 7B, respectively.

Finally, a source electrode 10S is formed on the source contact structure 9S and the backgate contact structure 9B, and a drain electrode 10D is formed on the drain contact structure 9D.

In the power semiconductor device of FIG. 1, in order to enhance the breakdown voltage of the device, the n⁻-type drain drift impurity diffusion region 2 is made larger in size, while the impurity concentration thereof is made smaller. That is, the n⁻-type drain drift impurity diffusion region 2 is longer and deeper. For example, the n⁻-type drain drift impurity diffusion region 2 is much deeper than the n⁺-type source impurity diffusion region 7S and the n⁺-type drain impurity diffusion region 7D. As a result, the ON-resistance of the device is made smaller. In other words, the higher the breakdown voltage, the smaller the ON-resistance. Thus, the breakdown voltage has a trade-off relationship with the ON-resistance.

The operation of the power semiconductor device of FIG. 1 is explained below.

As shown in FIG. 1, when a voltage at the gate electrode 5 is higher than a threshold voltage of the device, a channel region formed by an n-type inversion region as indicated by C is generated in a surface portion of the p⁻-type silicon substrate 1 and the p-type base impurity diffusion region 6 immediately below the gate silicon dioxide layer 4, so that the device is turned ON. As a result, electrons are supplied from the source electrode 10S via the source contact structure 9S, the n⁺-type source impurity region 7S and the channel region C to the n⁻-type drain drift impurity diffusion region 2. In this case, the electrons spread within the n⁻-type drain drift impurity diffusion region 2 in accordance with the impurity concentration thereof. Therefore, a part of the electrons as indicated by X1 pass through the n⁻-type drain drift impurity region 2 through a shallow stream to reach the n⁺-type drain impurity diffusion region 7D. Also, a part of the electrons as indicated through X2 pass through the n⁺-type drain drift impurity region 2 through a middle stream to reach the n⁺-type drain impurity diffusion region 7D. Further, a part of the electrons as indicated by X3 pass through the drain drift impurity region 2 through a deep stream to reach the n⁺-type drain impurity diffusion region 7D. Thus, a drain current $I_d$ flows from the drain electrode 10D to the source electrode 10S.

In the device of FIG. 1, however, since the electrons as indicated by X2 and X3 have longer motion distances within the n⁻-type drain drift impurity diffusion region 2 than the electrons indicated by X1, the ON-resistance is substantially increased.

On the other hand, when the voltage at the gate electrode 5 is lower than the threshold voltage of the device, the above-mentioned channel region C is not generated, so that the device is turned OFF. In this state, when the gate electrode 5 and the source electrode 10S are grounded while a voltage of 60V is applied to the drain electrode 10D, equipotential lines indicated by dotted lines are generated as shown in FIG. 2. That is, the equipotential line of 0V is distributed immediately below the gate silicon dioxide layer 4 within the p-type base impurity diffusion region 6 is deeper in the silicon substrate 1. Also, the equipotential line of 60V is distributed from the end of the n⁺-type drain impurity diffusion region 7D immediately below the field silicon dioxide layer 3 and surrounds the n⁺-type drain impurity diffusion region 7D. Further, equipotential lines of 10V, 20V, 30V, 40V and 50V are distributed-equidistantly between the equipotential lines of 0V and 60V. Thus, a high breakdown voltage characteristic can be obtained.

Figure 3:
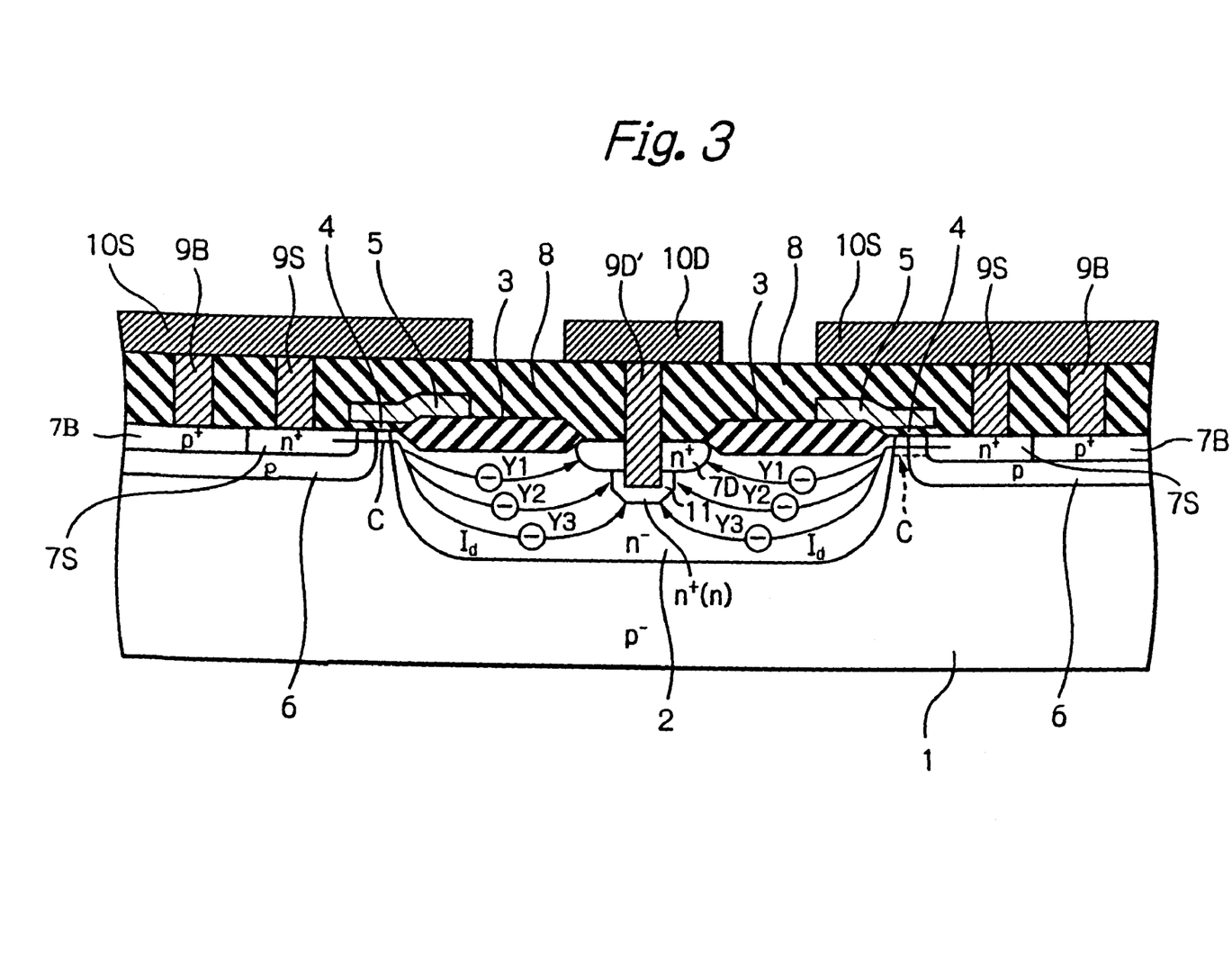
FIG. 3 is a cross-sectional view illustrating a first embodiment of the power semiconductor device according to the present invention.

In FIG. 3, which illustrates a first embodiment of the power semiconductor device according to the present invention, an n⁺-type or n-type drain buried impurity diffusion region 11 is provided within the n⁻-type drain drift impurity diffusion region 2 of FIG. 1 immediately below the n⁺-type drain impurity diffusion region 7D of FIG. 1. In this case, the drain buried impurity diffusion region 11 has a larger impurity concentration than the n⁻-type drain drift region 2. For example, the drain buried impurity diffusion region 11 has about the same impurity concentration as that of the n⁺-type drain impurity diffusion region 7D. Otherwise, the drain buried impurity diffusion region 11 has an impurity concentration between that of the n⁺-type drain impurity diffusion region 7D and that of the n⁻-type drain drift impurity diffusion region 2. Also, the transverse size of the drain buried impurity diffusion region 11 is smaller than that of the n⁺-type drain impurity diffusion region 7D. Further, a drain contact structure 9D' is provided instead of the drain contact structure 9D of FIG. 1, and penetrates the n⁺-type drain impurity diffusion region 7D to reach the drain buried impurity diffusion region 11.

The operation of the power semiconductor device of FIG. 3 is explained below.

As shown in FIG. 3, when a voltage at the gate electrode 5 is higher than a threshold voltage of the device, a channel region formed by an n-type inversion region as indicated by C is generated in a surface portion of the p⁻-type silicon substrate 1 and the p-type base impurity diffusion region 6 immediately below the gate silicon dioxide layer 4, so that the device is turned ON. As a result, electrons are supplied from the source electrode 10S via the source contact structure 9S, the n$^+$-type source impurity diffusion region 7S and the channel region C to the n$^-$-type drain drift impurity diffusion region 2. In this case, the electrons spread within the n$^-$-type drain drift impurity diffusion region 2 in accordance with the impurity concentration thereof. Therefore, a part of the electrons as indicated by Y1 pass through the n$^-$-type drain drift impurity region 2 through a shallow stream to reach the n$^+$-type drain impurity diffusion region 7D. Also, a part of the electrons as indicated by Y2 pass through the n$^-$-type drain drift impurity region 2 through a middle stream to reach the side of the drain buried impurity diffusion region 11. Further, a part of the electrons as indicated by Y3 pass through the drain drift impurity region 2 through a deep stream to reach the bottom of the drain buried impurity diffusion region 11. Thus, a drain current $I_d$ flows from the drain electrode 10D to the source electrode 10S.

In the power semiconductor device of FIG. 3, since the electrons as indicated by Y2 and Y3 have about the same motion distance within the n$^-$-type drain drift impurity diffusion region 2 as the electrons indicated by Y1, the ON-resistance is substantially decreased. In this case, since the drain contact structure 9D' made of low resistance material is connected to the drain buried impurity diffusion region 11 as well as the n$^+$-type drain impurity diffusion region 7D, the electrons injected into the drain buried impurity diffusion region 11 and the n$^+$-type drain impurity diffusion region 7D are rapidly transferred to the drain electrode 10D, thus further decreasing the ON-resistance.

Figure 4:
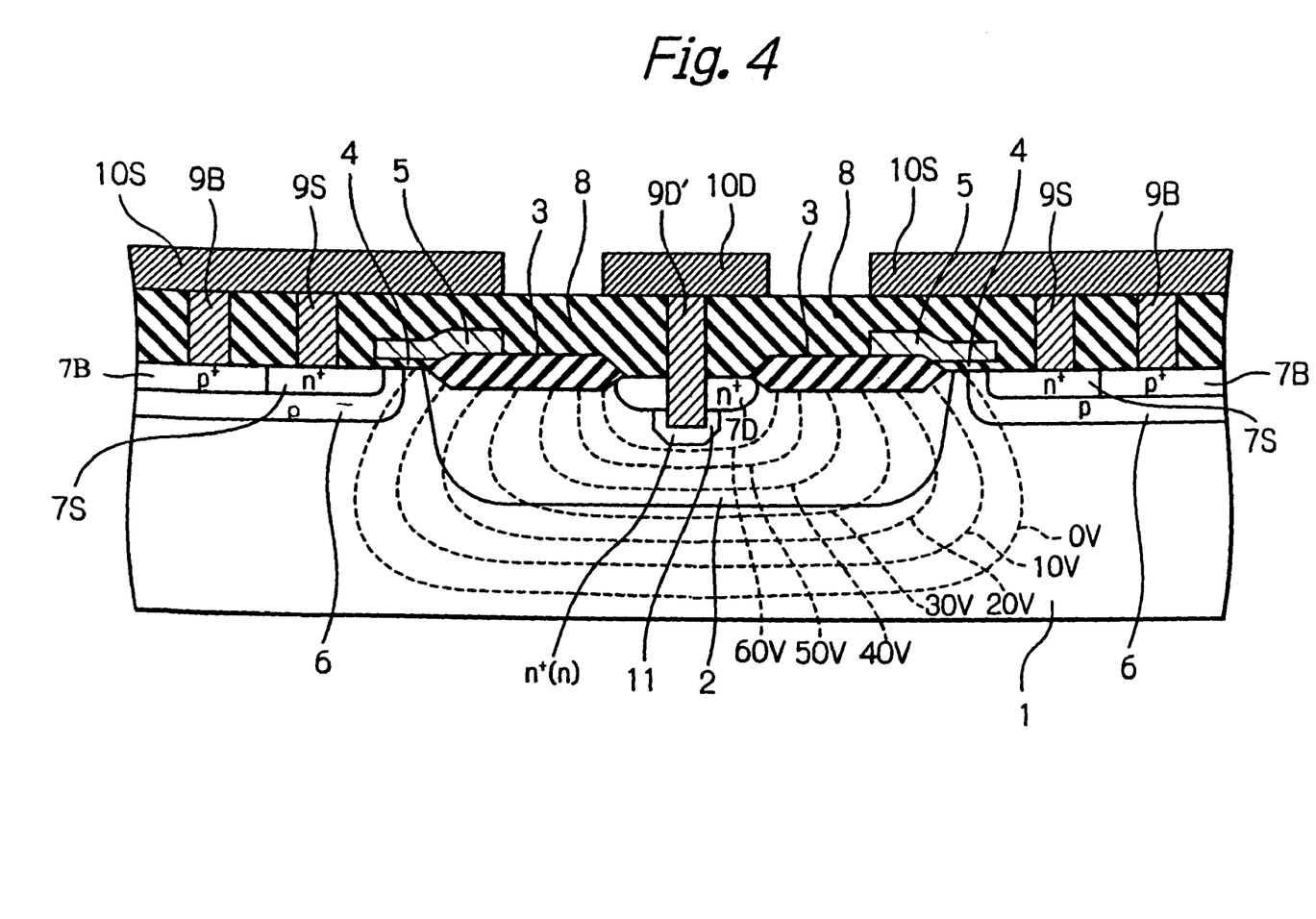
FIG. 4 is a cross-sectional view for explaining the operation of the power semiconductor device of FIG. 3.

On the other hand, when the voltage at the gate electrode 5 is lower than the threshold voltage of the device, the above-mentioned channel region C is not generated, so that the device is turned OFF. In this state, when the gate electrode 5 and the source electrode IOS are grounded while a voltage of 60V is applied to the drain electrode 10D, equipotential lines indicated by dotted lines are generated as shown in FIG. 4. That is, the equipotential line of 0V is distributed immediately below the gate silicon dioxide layer 4 within the p-type base impurity diffusion region 6 and is deeper in the silicon substrate 1. Also, the equipotential line of 60V is distributed from the end of the n$^+$-type drain impurity diffusion region 7D immediately below the field silicon dioxide layer 3 and surrounds the drain buried impurity diffusion region 11. Further, equipotential lines of 10V, 20V, 30V, 40V and 50V are distributed equidistantly between the equipotential lines of 0V and 60V. Thus, a high breakdown voltage characteristic can be also obtained in the same way as in FIG. 2.

A method for manufacturing the power semiconductor device of FIG. 3 is explained next with reference to FIGS. 5A, through 5I as well as FIG. 3.

Figure 5A:
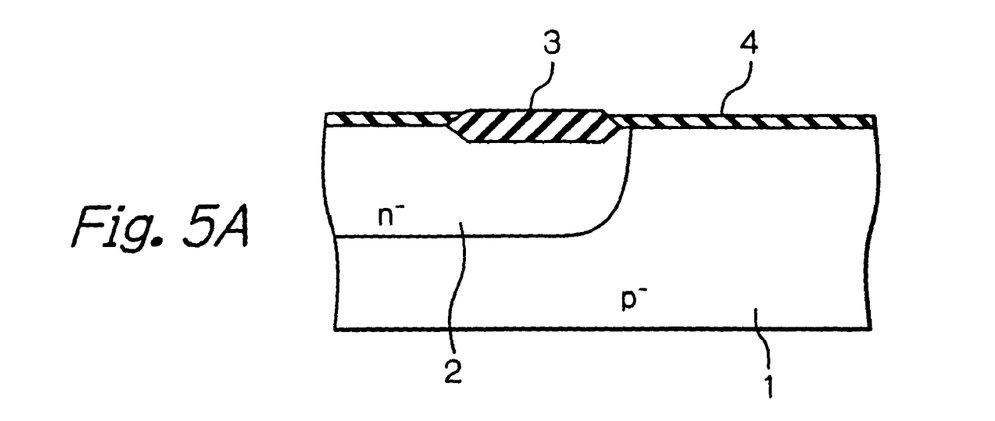
FIGS. 5A through 5I are cross-sectional views for explaining a method for manufacturing the power semiconductor device of FIG. 3.

First, referring to FIG. 5A, an about 600 to 700 μm thick p$^-$-type monocrystalline silicon substrate 1 having a concentration of about $1\times10^{14}$ to $1\times10^{16}$ borons per cm$^3$ is prepared. Then, phosphorus ions are implanted into the silicon substrate 1 using a mask layer (not shown) to form an n$^-$-type drain drift impurity diffusion region 2 within the silicon substrate 1. Then, an about 0.3 to 1.5 μm thick field silicon dioxide layer 3 is formed on the n$^-$-type drain drift impurity diffusion region 2 by a local oxidation of silicon (LOCOS) process. Then, an about 8 to 50 nm thick gate silicon dioxide layer 4 is grown by thermally oxidizing the silicon substrate 1.

Figure 5B:
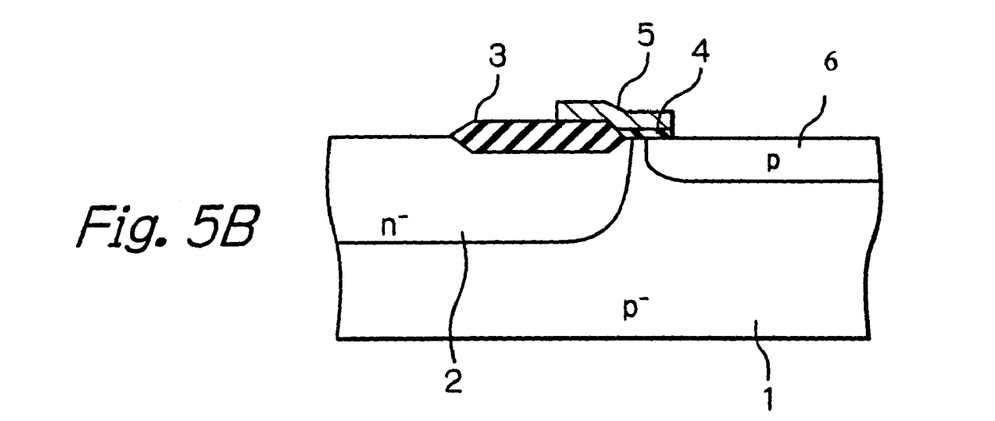

Next, referring to FIG. 5B, an about 0.2 to 0.6 μthick gate electrode 5 made of polycide formed by polycrystalline silicon and refractory metal silicide such as tungsten silicon (WSi) or made of silicide such as titanium silicon (TiSi) or cobalt silicon (CoSi) is deposited by a chemical vapor deposition (CVD) process on the entire surface. Then, the gate electrode 5 is patterned by a photolithography and etching process. Then, about $1\times10^{15}$ to $1\times10^{17}$ boron ions per cm$^3$ are implanted into the silicon substrate 1 by using a mask layer (not shown) in self-alignment with the gate electrode 5 to form a p-type base impurity diffusion region 6 in the silicon substrate 1.

Figure 5C:
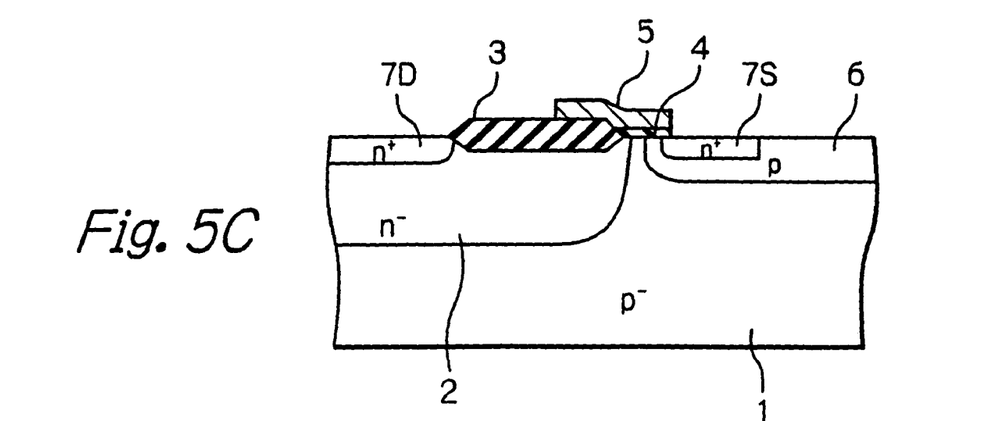

Next, referring to FIG. 5C, about $1\times10^{19}$ to $1\times10^{21}$ phosphorus ions or arsenic ions per cm$^3$ are implanted into the silicon substrate 1 by using a mask layer (not shown) to form an n$^+$-type source impurity diffusion region 7S in the p-type base impurity diffusion region 6 and an n$^+$-type drain impurity diffusion region 7D in the n$^-$-type drain drift impurity diffusion region 2.

Figure 5D:
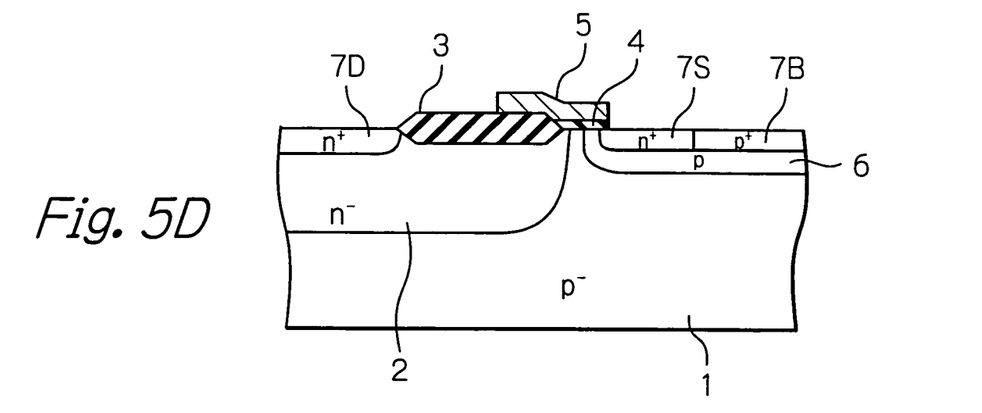

Next, referring to FIG. 5D, about $1\times10^{19}$ to $1\times10^{21}$ boron ions per cm$^3$ are implanted into the silicon substrate 1 by using a mask layer (not shown) to form a p$^+$-type backgate impurity diffusion region 7B in the p-type base impurity diffusion region 6.

Figure 5E:
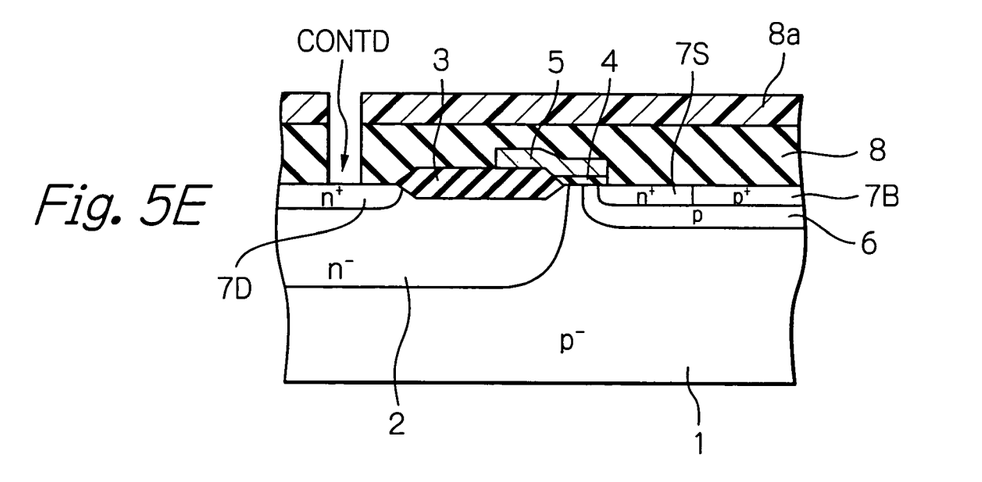

Next, referring to FIG. 5E, an about 0.3 to 1.5 μm thick silicon dioxide interlayer 8 is deposited on the entire surface by a CVD process. Then, a photoresist pattern layer 8$a$ is formed by a photolithography process, and an etching process is performed upon the silicon dioxide interlayer 8 by using the photoresist pattern layer 8$a$, to perforate a contact hole CONTD in the silicon dioxide interlayer 8.

Figure 5F:
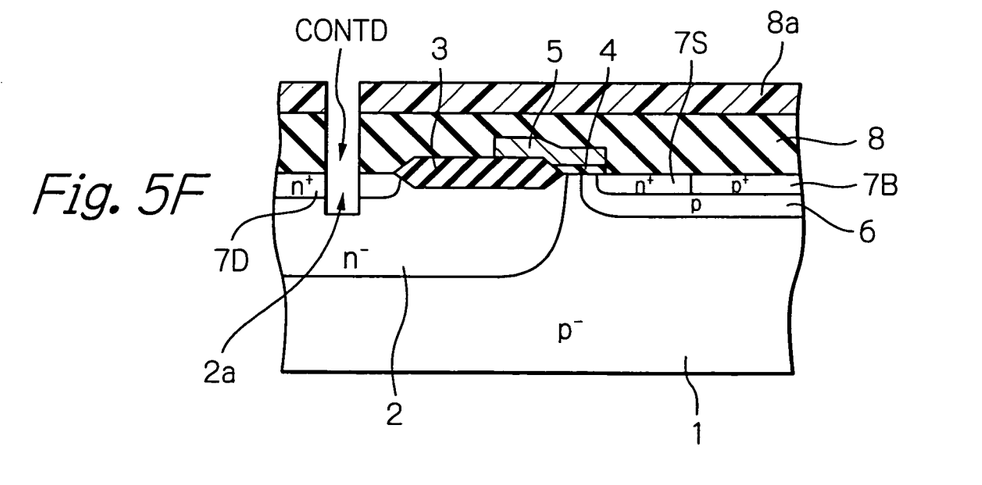

Next, referring to FIG. 5F, an etching process is performed upon the n$^+$-type drain impurity diffusion region 7D and the n$^-$-type drain drift impurity diffusion region 2 by using the photoresist pattern layer 8$a$. As a result, an about 0.3 to 1.5 μm deep trench 2$a$ is formed therein.

Figure 5G:
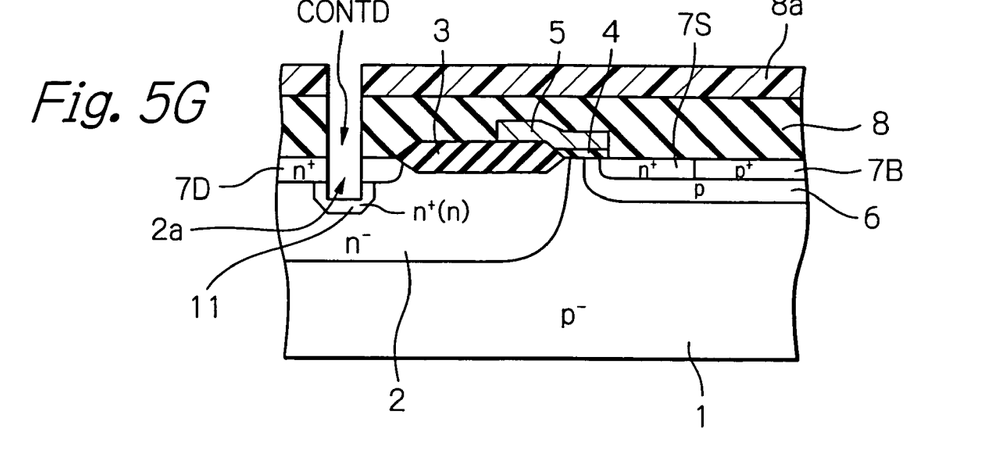

Next, referring to FIG. 5G, about $1\times10^{19}$ to $1\times10^{21}$ phosphorus ions or arsenic ions per cm$^3$ are implanted into the n$^-$-type.drain drift impurity diffusion region 2, to form a drain buried impurity diffusion region 11. In this case, the drain buried impurity diffusion region 11 has about the same impurity concentration as that of the n$^+$-type drain impurity diffusion region 7D, i.e., the drain buried impurity diffusion region 11 is of an n$^+$-type. However, about $1\times10^{16}$ to $1\times10^{18}$ phosphorus ions or arsenic ions per cm$^3$ can be implanted into the n$^-$-type drain drift impurity diffusion region 2; in this case, the drain buried impurity diffusion region 11 has an impurity concentration between that of the n$^+$-type drain impurity diffusion region 7D and that of the n$^-$-type drain drift impurity diffusion region 2, i.e., the drain buried impurity diffusion region 11 is of an n-type. Also, the transverse size of the drain buried impurity diffusion region 11 is about 0.1 to 1.0 μm smaller than the transverse size of the n$^+$-type drain impurity diffusion region 7D. Then, the photoresist pattern layer 8$a$ is removed.

Figure 5H:
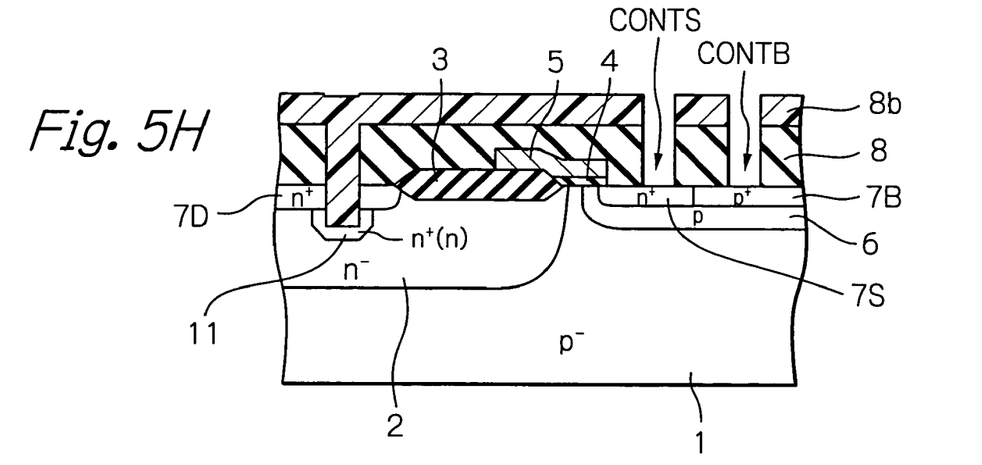

Next, referring to FIG. 5H, a photoresist pattern layer 8$b$ is formed by a photolithography process, and an etching process is performed upon the silicon dioxide interlayer 8 by using the photoresist pattern layer 8$b$ to perforate contact holes CONTS and CONTB in the silicon dioxide interlayer 8. Then, the photoresist pattern layer 8$b$ is removed.

Note that the contact holes CONTD, CONTS and CONTB are reversely-tapered to have a taper angle of about 80° to 90°.

Figure 5I:
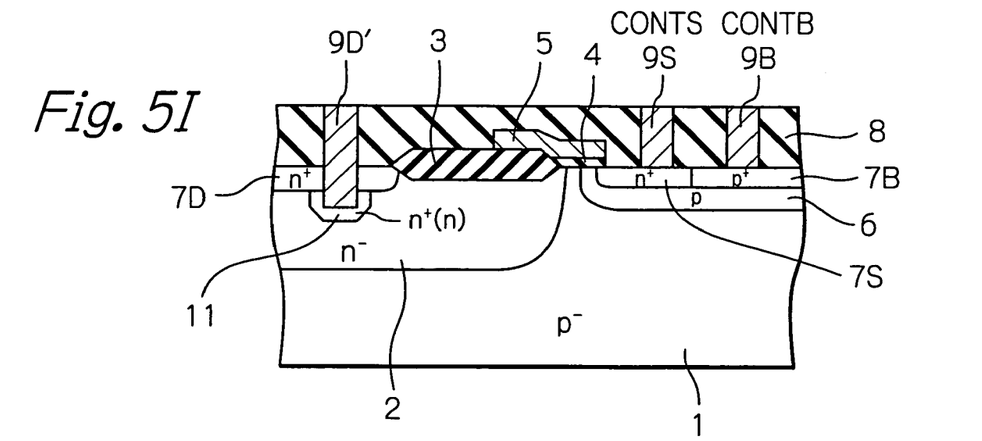

Next, referring to FIG. 5I, a conductive layer made of tungsten (W) is deposited on the entire surface by a CVD process. Then, the conductive layer is etched back, so that a source contact structure 9S, a drain contact structure 9D' and a backgate contact structure 9B are buried in the contact holes CONTS, CONTD and CONTB, respectively. As a result, the source contact structure 9S, the drain contact structure 9D' and the backgate contact structure 9B are connected to the n$^+$-type source impurity diffusion region 7S, the n$^+$-type drain impurity diffusion region 7D and the p$^+$-type backgate impurity diffusion region 7B, respectively. In this case, the drain contact structure 9D' penetrates the n$^+$-type drain impurity diffusion region 7D to reach the drain buried impurity diffusion region 11.

Finally, referring to FIG. 3, a conductive layer made of aluminum or the like is deposited on the entire surface by a CVD process. Then, the conductive layer is patterned by a photolithography and etching process to form a source electrode 10S and a drain electrode 10D. In this case, the source electrode 10S is connected to the source contact structure 9S and the backgate contact structure 9B, and the drain electrode 10D is connected to the drain contact structure 9D'.

A modification of the manufacturing method as shown in FIGS. 5A through 5I is explained next with reference to FIGS. 6A, 6B and 6C which replace FIGS. 5E, 5F, 5G and 5H.

Figure 6A:
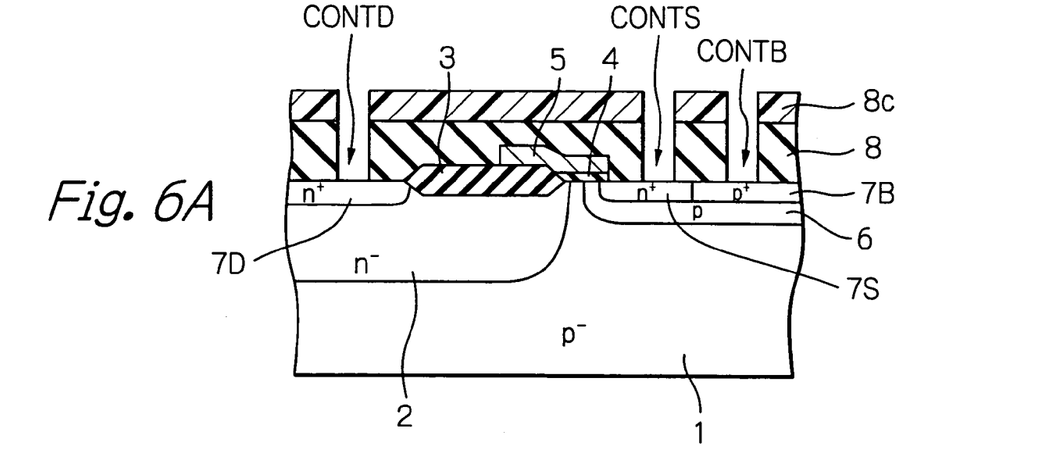
FIGS. 6A, 6B and 6C are cross-sectional views for explaining a modification of the manufacturing method as illustrated in FIGS. 5A through 5I.

After the process as shown in FIG. 5D, referring to FIG. 6A, an about 0.3 to 1.5 μm thick silicon dioxide interlayer 8 is deposited on the entire surface by a CVD process. Then, a photoresist pattern layer 8c is formed by a photolithography process, and an etching process is performed upon the silicon dioxide interlayer 8 by using the photoresist pattern layer 8c, to perforate contact holes CONTS, CONTD and CONTB in the silicon dioxide interlayer 8. Then, the photoresist pattern layer 8c is removed.

Figure 6B:
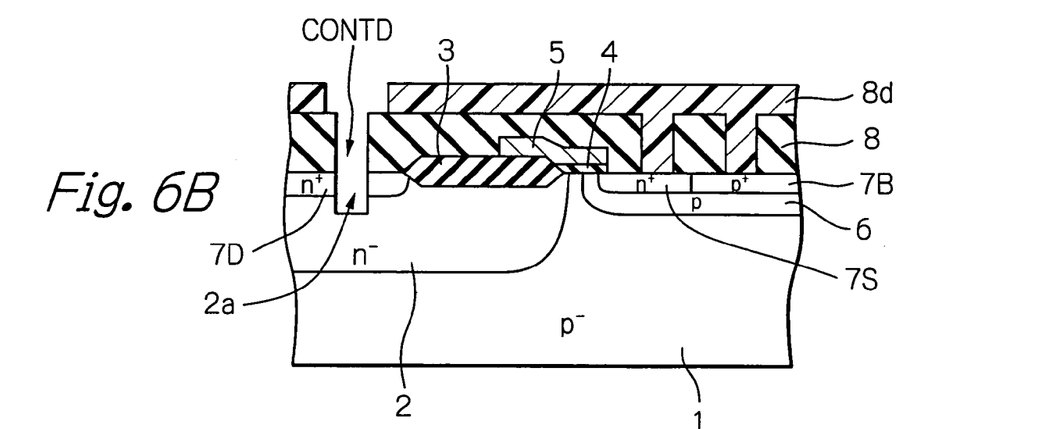

Next, referring to FIG. 6B, a photoresist pattern layer 8d is formed by a photolithography process, and an etching process is performed upon the n$^+$-type drain impurity diffusion region 7D and the n$^-$-type drain drift impurity diffusion region 2 by using the photoresist pattern layer 8d. As a result, an about 0.3 to 1.5 μm deep trench 2a is formed therein.

Figure 6C:
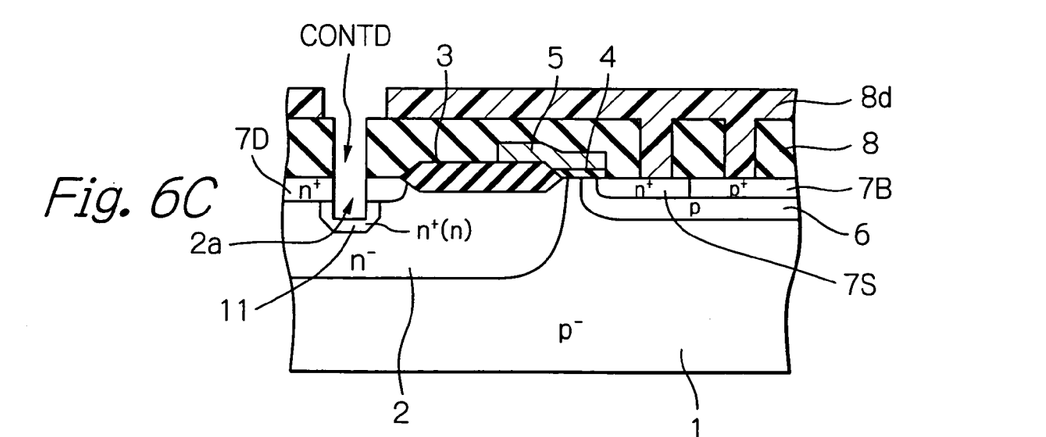

Next, referring to FIG. 6C, about $1 \times 10^{19}$ to $1 \times 10^{21}$ phosphorus ions or arsenic ions per cm$^3$ are implanted into the n$^-$-type drain drift impurity diffusion region 2, to form a drain buried impurity diffusion region 11. Also in this case, the drain buried impurity diffusion region 11 has about the same impurity concentration as that of the n$^+$-type drain impurity diffusion region 7D, i.e., the drain buried impurity diffusion region 11 is of an n$^+$-type. However, about $1 \times 10^{16}$ to $1 \times 10^{18}$ phosphorus ions or arsenic ions per cm$^3$ can be implanted into the n$^-$-type drain drift impurity diffusion region 2; in this case, the drain buried impurity diffusion region 11 has an impurity concentration between that of the n$^+$-type drain impurity diffusion region 7D and that of the n-type drain drift impurity diffusion region 2, i.e., the drainburied impurity diffusion region 11 is of an n-type. Also, the transverse size of the drain buried impurity diffusion region 11 is about 0.1 to 1.0 μm smaller than the transverse size of the n$^+$-type drain impurity diffusion region 7D. Then, the photoresist pattern layer 8d is removed.

Then, the process proceeds to a process as shown in FIG. 5I.

Thus, in the modification as shown in FIGS. 6A, 6B, and 6C, since the contact holes CONTS, CONTD and CONTB are simultaneously perforated, the manufacturing steps can be simplified as compared with those of FIGS. 5A through 5I.

Figure 7:
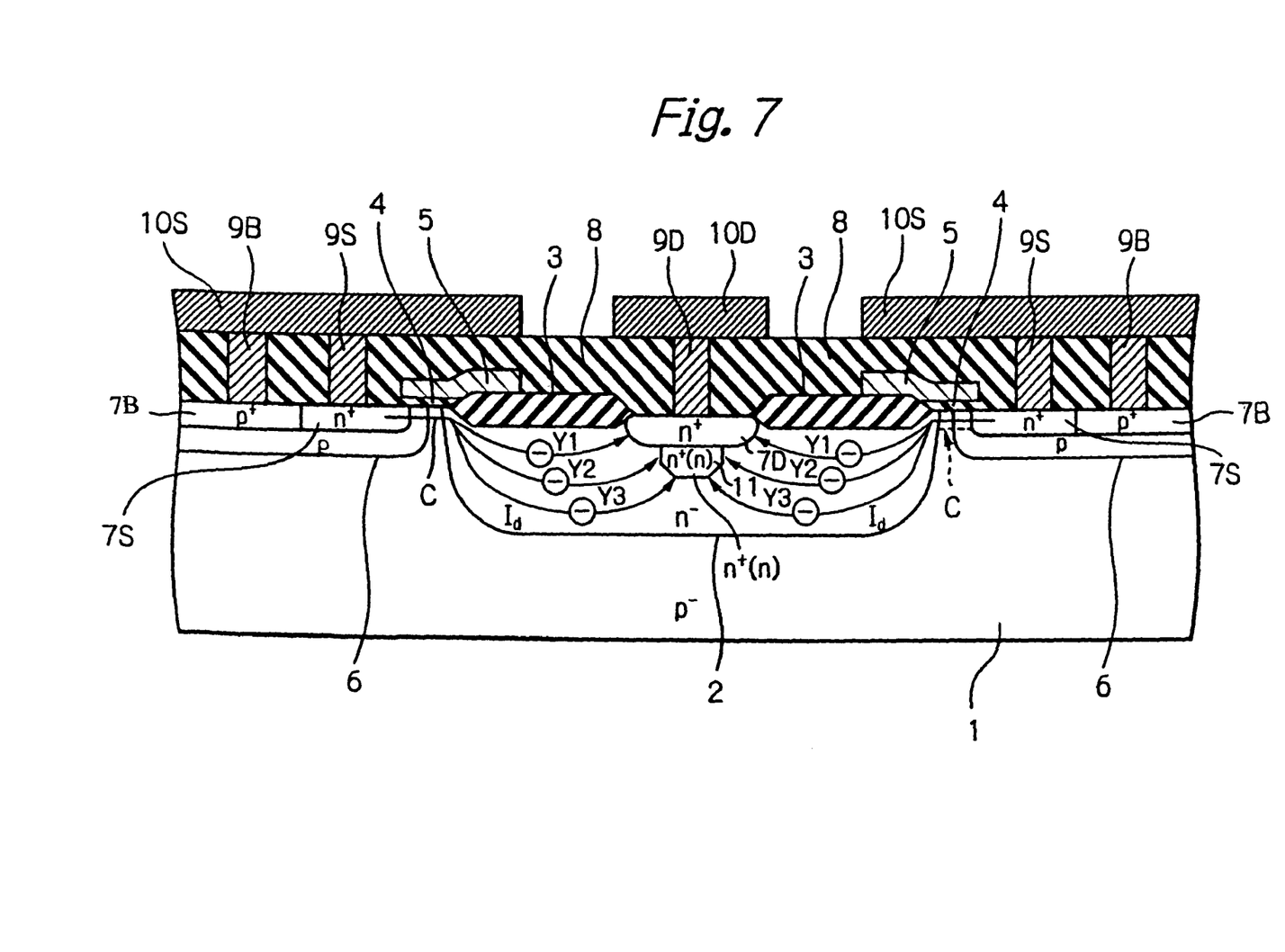
FIG. 7 is a cross-sectional view illustrating a second embodiment of the power semiconductor device according to the present invention.

In FIG. 7, which illustrates a second embodiment of the power semiconductor device according to the present invention, the drain contact structure 9D' of FIG. 3 is replaced by the drain contact structure 9D in the same way as in FIG. 1. That is, the drain contact structure 9D does not penetrate the n$^+$-type drain impurity diffusion region 7D so that the drain contact structure 9D does not reach the n$^+$-type or n$^-$-type drain buried impurity diffusion region 11.

The operation of the power semiconductor device of FIG. 7 is explained below.

As shown in FIG. 7, in a similar way to that in FIG. 3, when a voltage at the gate electrode 5 is higher than a threshold voltage of the device, a channel region formed by an n-type inversion region as indicated by C is generated in a surface portion of the p$^-$-type silicon substrate 1 and the p-type base impurity diffusion region 6 immediately below the gate silicon dioxide layer 4, so that the device is turned ON. As a result, electrons are supplied from the source electrode 10S via the source contact structure 9S, the n$^+$-type source impurity region 7S and the channel region C to the n$^-$-type drain drift impurity diffusion region 2. In this case, the electrons spread within the n$^-$-type drain drift impurity diffusion region 2 in accordance with the impurity concentration thereof. Therefore, a part of the electrons as indicated by Y1 pass through the n$^-$-type drain drift impurity region 2 through a shallow stream to reach the n$^+$-type drain impurity diffusion region 7D. Also, a part of the electrons as indicated by Y2 pass through the n$^-$-type drain drift impurity region 2 through a middle stream to reach the side of the drain buried impurity diffusion region 11. Further, a part of the electrons as indicated by Y3 pass through the drain drift impurity region 2 through a deep stream to reach the bottom of the drain buried impurity diffusion region 11. Thus, a drain current $I_d$ flows from the drain electrode 10D to the source electrode 10S.

In the device of FIG. 7, since the electrons as indicated by Y2 and Y3 have about the same motion distance within the n$^-$-type drain drift impurity diffusion region 2 as the electrons indicated by Y1, the ON-resistance is substantially decreased. In this case, since the drain contact structure 9D does not reach the drain buried impurity region 11, the decrease of the ON-resistance is smaller as compared with the first embodiment.

Figure 8:
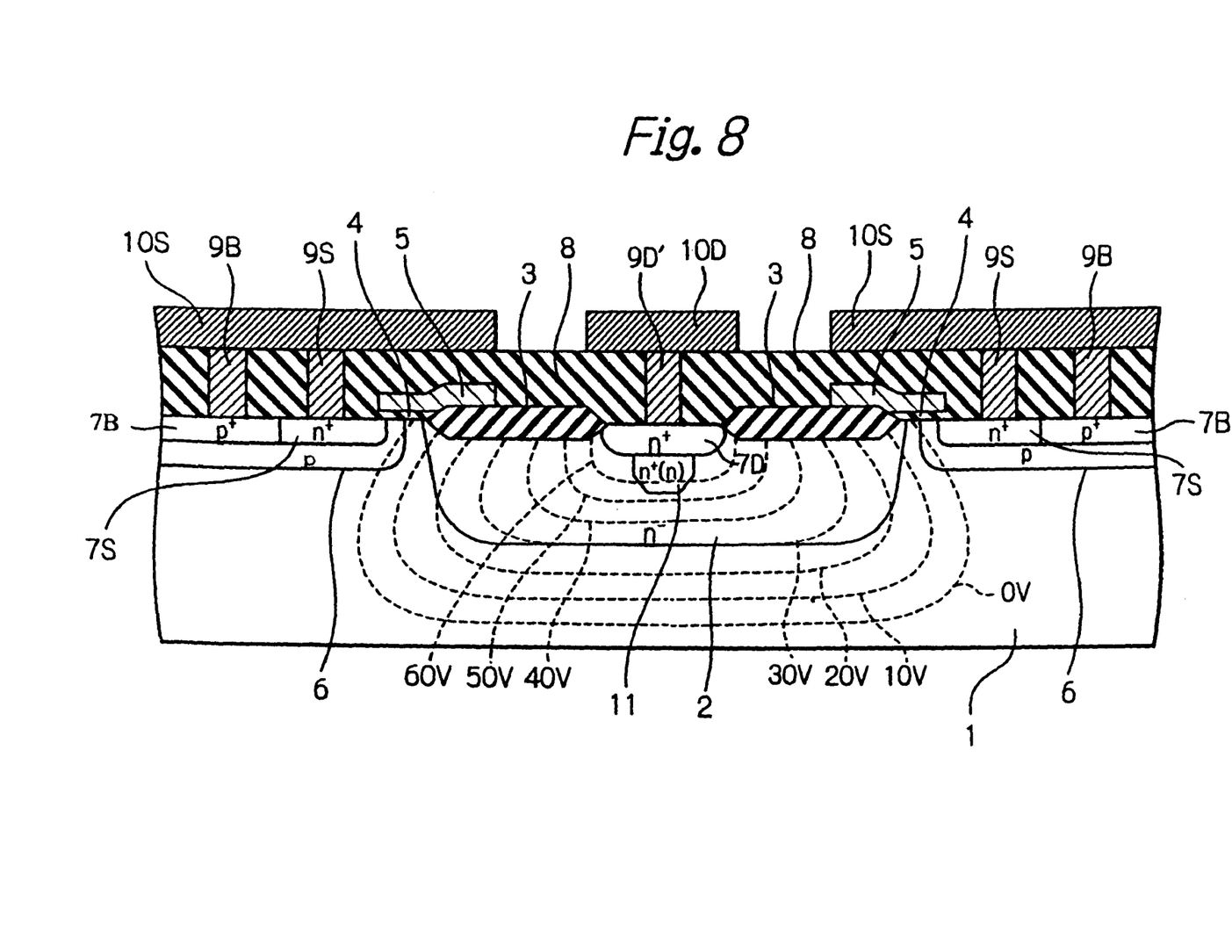
FIG. 8 is a cross-sectional view for explaining the operation of the power semiconductor device of FIG. 7.

On the other hand, when the voltage at the gate electrode 5 is lower than the threshold voltage of the device, the above-mentioned channel region C is not generated, so that the device is turned OFF. In this state, when the gate electrode 5 and the source electrode 10S are grounded while a voltage of 60V is applied to the drain electrode 10D, equipotential lines indicated by dotted lines are generated as shown in FIG. 8. That is, the equipotential line of 0V is distributed immediately below the gate silicon dioxide layer 4 and within the p-type base impurity diffusion region 6 and is deeper in the silicon substrate 1. Also, the equipotential line of 60V is distributed from the end of the n$^+$-type drain impurity diffusion region 7D immediately below the field silicon dioxide layer 3 and surrounds the drain buried impurity diffusion region 11. Further, equipotential lines of 10V, 20V, 30V, 40V and 50V are distributed equidistantly between the equipotential lines of 0V and 60V. Thus, a high breakdown voltage characteristic can be also obtained as in the same way in FIG. 2.

A method for manufacturing the power semiconductor device of FIG. 7 is explained next with reference to FIGS. 5A through 5D, 9A, 9B and 5I.

Figure 9A:
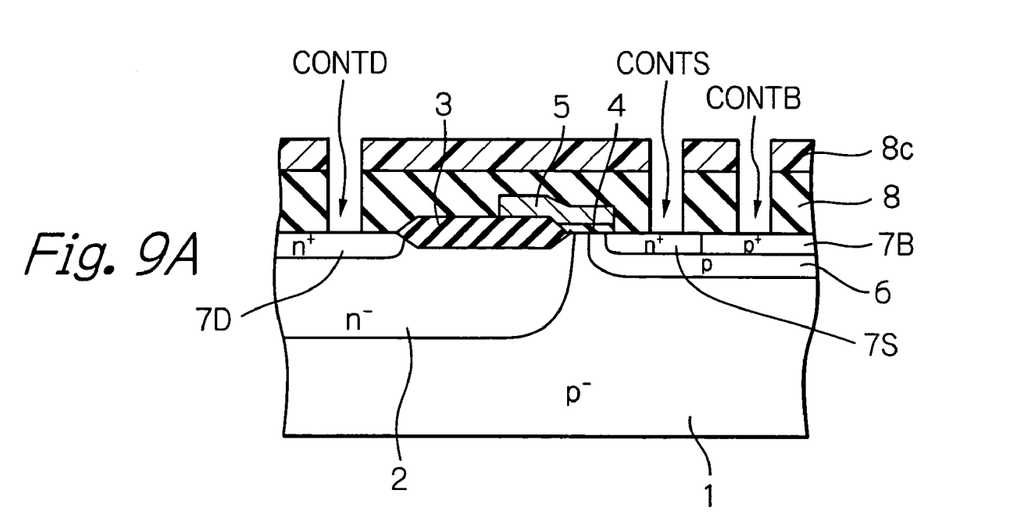
FIGS. 9A and 9B are cross-sectional views for explaining a method for manufacturing the power semiconductor device of FIG. 7.

After the processes as shown in FIGS. 5A through 5D, referring to FIG. 9A, an about 0.3 to 1.5 μm thick silicon dioxide interlayer 8 is deposited on the entire surface by a CVD process. Then, a photoresist pattern layer 8c is formed by a photolithography process, and an etching process is performed upon the silicon dioxide interlayer 8 by using the photoresist pattern layer 8c, to perforate contact holes CONTS, CONTD and CONTB in the silicon dioxide interlayer 8. Then, the photoresist pattern layer 8c is removed.

Figure 9B:
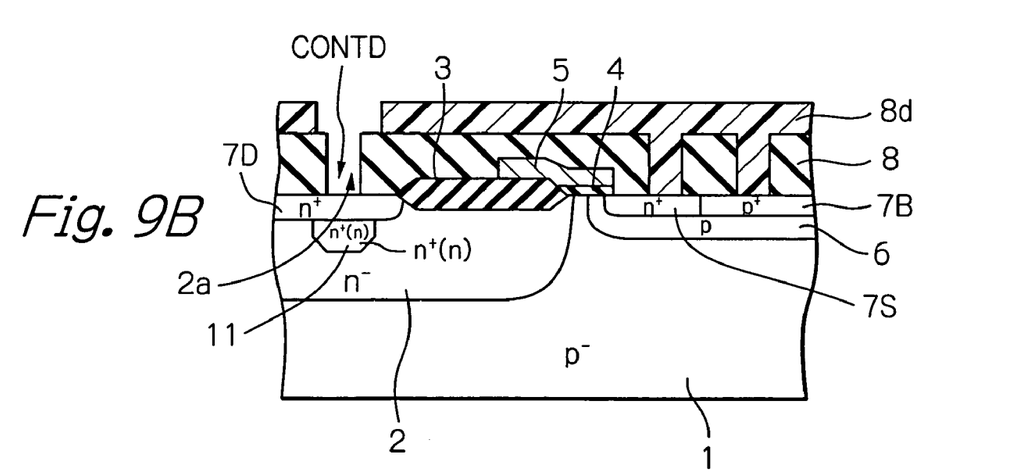

Next, referring to FIG. 9B, a photoresist pattern layer 8d is formed by a photolithography process, and about $1 \times 10^{19}$ to $1 \times 10^{21}$ phosphorus ions or arsenic ions per cm$^3$ are implanted into the n$^-$-type drain drift impurity diffusion region 2, to form a drain buried impurity diffusion region 11. Also in this case, the drain buried impurity diffusion region 11 has about the same impurity concentration as that of the n$^+$-type drain impurity diffusion region 7D, i.e., the drain buried impurity diffusion region 11 is of an n$^+$-type. However, about $1\times10^{16}$ to $1\times10^{18}$ phosphorus ions or arsenic ions per cm$^3$ can be implanted into the n-type drain drift impurity diffusion region 2; in this case, the drain buried impurity diffusion region 11 has an impurity concentration between that of the n$^+$-type drain impurity diffusion region 7D and that of the n$^-$-type drain drift impurity diffusion region 2, i.e., the drain buried impurity diffusion region 11 is of an n-type. Also, the transverse size of the drain buried impurity diffusion region 11 is about 0.1 to 1.0 µm smaller than the transverse size of the n$^+$-type drain impurity diffusion region 7D. Then, the photoresist pattern layer 8$d$ is removed.

Then, the process proceeds to a process as shown in FIG. 5I.

Thus, in the method as shown in FIGS. 9A and 9B, since the drain contact structure 9D does not reach the drain buried impurity diffusion region 11, the manufacturing steps can be simplified as compared with those of FIGS. 5A through 5I.

In MOS technology, the terms "source" and "drain" are interchangeable. For example, if the n$^+$-type impurity diffusion region 7S is denoted by a drain impurity diffusion region, the n$^+$-type impurity diffusion region 7D and the buried impurity diffusion region 11 can be denoted by a source impurity diffusion region and a source buried impurity diffusion region, respectively.

In the above-described embodiments, n-channel power MOS transistors are illustrated; however, the present invention can be applied to p-channel power MOS transistors. Also, the gate silicon dioxide layer 4 can be replaced by other insulating layers made of silicon nitride or silicon nitride / silicon dioxide, so that the present invention can be applied to a metal nitride semiconductor (MNS) device or a metal nitride oxide semiconductor (MNOS) device. Further, the gate silicon dioxide layer 4 can be replaced by an insulated gate structure, so that the present invention can be applied to an insulated gate bipolar transistor (IGBT).

As explained hereinabove, according to the present invention, the ON-resistance can be decreased without substantially decreasing the breakdown voltage.

The invention claimed is:

1. A power semiconductor device comprising:
   a semiconductor substrate of a first conductivity type;
   a source region of a second conductivity type formed in a surface portion of said semiconductor substrate, said source region being formed in a well of said first conductivity type, said well having a higher impurity concentration than said semiconductor substrate;
   a drain drift region of said second conductivity type formed in the surface portion of said semiconductor substrate, said drain drift region being apart from said well containing said source region, as separated by said semiconductor substrate;
   a drain region of said second conductivity type formed in a surface portion of said drain drift region, said drain region having a larger impurity concentration than said drain drift region;
   a drain buried region of said second conductivity type formed immediately below said drain region in said drain drift region, said drain buried region having a larger impurity concentration than said drain drift region;
   a gate insulating layer formed on said semiconductor substrate between said source region and said drain drift region; and
   a gate electrode formed on said gate insulating layer,
   wherein a transverse size of said drain buried region, at each point along a longitudinal axis of said drain buried region, is smaller than a transverse size of said drain region.

2. The power semiconductor device as set forth in claim 1, wherein the impurity concentration of said drain buried region is about the same as the impurity concentration of said drain region.

3. The power semiconductor device as set forth in claim 1, wherein the impurity concentration of said drain buried region is between the impurity concentration of said drain region and the impurity concentration of said drain drift region.

4. The power semiconductor device as set forth in claim 1, further comprising a drain contact structure connected to said drain region.

5. The power semiconductor device as set forth in claim 1, further comprising a drain contact structure penetrating said drain region to reach said drain buried region.

6. The power semiconductor device as set forth in claim 1, further comprising a field insulating layer formed on said drain drift region adjacent to said gate insulating layer, said field insulating being thicker than said gate insulating layer.

7. The power semiconductor device as set forth in claim 1, further comprising a base region of said first conductivity type formed in the surface portion of said semiconductor substrate below said gate insulating layer adjacent to said source region.

8. The power semiconductor device as set forth in claim 1, wherein said drain drift region is spaced apart laterally from said source region.

9. The power semiconductor device as set forth in claim 1, a configuration of which is such that electrons flow through an on channel from said gate region across similar distances to said drain region and from said gate region to said drain buried region.

10. The power semiconductor device of claim 1, said drain buried region shaped such that a distance travelled by carriers from said source region to said drain region is approximately equal regardless of a depth.

11. A method for manufacturing a power semiconductor device, comprising:
   forming, in a first surface portion of a semiconductor substrate of a first conductivity type, a drain drift region of a second conductivity type;
   forming, in a second surface portion of said semiconductor substrate, apart from said drain drift region, a well having said first conductivity type at a higher impurity concentration than said substrate;
   forming a gate insulating layer on said semiconductor substrate adjacent to said drain drift region;
   forming a gate electrode on said gate insulating layer;
   forming a source region and a drain region of said second conductivity type, said source region being formed in a surface region of said second portion of said semiconductor substrate, said drain region being formed in a surface region of said drain drift region and having a larger impurity concentration than said drain drift region;
   forming a drain buried region of said second conductivity type immediately below said drain region in said drain region, said drain buried region having a larger impurity concentration than said drain drift region; and forming a drain contact structure electrically connected to said drain region, wherein a transverse size of said drain buried region, at each point along a longitudinal axis of said drain buried region, is smaller than a transverse size of said drain region.

12. The method as set forth in claim 11, wherein the impurity concentration of said drain buried region is about the same as the impurity concentration of said drain region.

13. The method as set forth in claim 11, wherein the impurity concentration of said drain buried region is between the impurity concentration of said drain region and the impurity concentration of said drain drift region.

14. The method as set forth in claim 11, further comprising:
perforating a trench in said drain region before said drain contact structure is electrically connected to said drain region,
wherein the second conductivity impurity ions of said drain buried region are implanted through said trench, and said drain contact structure is formed in said trench.

15. The method as set forth in claim 11, further comprising:
forming an insulating interlayer on said source region and said drain region;
forming a source contact hole and a drain contact hole in said insulating interlayer, said source contact region and said drain contact region exposing said source region and said drain region, respectively,
said drain buried region forming comprising forming said drain buried region of said second conductivity type immediately below said drain region in said drain drift region by ion-implantation through said drain contact hole,
said method further comprising burying a source contact structure and a drain contact structure in said source contact hole and said drain contact hole, respectively, so that said source contact structure is connected to said source region, and said drain contact structure penetrates said drain region and reaches said drain buried region.

16. A method as set forth in claim 11, wherein said drain drift region is spaced apart laterally from said source region.

17. A method as set forth in claim 11, the device being formed such that electrons flow through an on channel from said gate region across similar distances to said drain region and from said gate region to said drain buried region.

18. The method as set forth in claim 11, further comprising:
forming an insulating interlayer on said source region and said drain region before said drain buried region is formed;
forming a drain contact hole in said insulating interlayer exposing said drain region; and
removing said drain region in alignment with said drain contact hole,
said drain buried region forming comprising forming said drain buried region of said second conductivity type immediately below said drain region in said drain drift region by ion-implantation through said drain contact hole and said removed drain region, said method further comprising:
forming a source contact hole in said insulating interlayer exposing said source region; and
burying a source contact structure and a drain contact structure in said source contact hole and said drain contact hole, respectively, so that said source contact structure is connected to said source region, and said drain contact structure penetrates said drain region and reaches said drain buried region.

19. The method as set forth in claim 18, wherein said drain contact hole and said source contact hole are simultaneously formed.

20. A power semiconductor device, comprising:
a semiconductor substrate of a first conductivity type at a first impurity concentration;
a first well formed on a surface of said semiconductor substrate, said first well having said first conductivity type at a higher impurity concentration than said first impurity concentration;
a source region of a second conductivity type formed in a surface portion of said first well;
a second well formed on the surface of said semiconductor substrate apart from said first well and as separated by said semiconductor substrate, said second well having said second conductivity type and forming a drain drift region;
a drain region of said second conductivity type formed in a surface portion of said second well, said drain region having a larger impurity concentration than said drain drift region;
a drain buried region of said second conductivity type formed in said drain drift region, said drain buried region being formed immediately below said drain region and having a larger impurity concentration than said drain drift region, wherein a transverse size of said drain buried region, at each point along a longitudinal axis of said drain buried region, is smaller than a transverse size of said drain region;
a gate insulating layer formed on said semiconductor substrate between said source region and said drain drift region; and
a gate electrode formed on said gate insulating layer.

* * * * *